United States Patent [19]

Maccabee

[11] Patent Number: 5,341,056
[45] Date of Patent: Aug. 23, 1994

[54] MAGNETOSTRICTIVE MOTOR SYSTEM

[75] Inventor: Bruce S. Maccabee, Sabillasville, Md.

[73] Assignee: The United States of America as represented the Secretary of the Navy, Washington, D.C.

[21] Appl. No.: 643,632

[22] Filed: Jan. 18, 1991

[51] Int. Cl.$^5$ .................. H01L 41/06; H01L 41/12; H02K 7/06

[52] U.S. Cl. .................................... 310/26; 310/83

[58] Field of Search ................ 310/20, 26, 46, 37, 310/83, 328, 273; 318/118, 135; 335/215

[56] References Cited

U.S. PATENT DOCUMENTS

| | | | |
|---|---|---|---|
| 2,398,117 | 4/1946 | Rost et al. | 177/38.6 |
| 2,730,103 | 1/1956 | Mackta | 128/305 |
| 3,200,668 | 8/1965 | Janes | 310/328 |
| 3,473,466 | 10/1965 | Thayer | 101/93 |
| 3,482,772 | 12/1965 | Thayer | 234/108 |
| 4,144,187 | 9/1992 | Culp | 310/328 |
| 4,455,501 | 6/1984 | Tojo et al. | 310/328 |
| 4,498,032 | 2/1985 | Pinson | 318/37 |
| 4,578,607 | 3/1986 | Toji et al. | 310/328 |
| 4,652,786 | 3/1987 | Mishiro | 310/333 |
| 4,703,464 | 10/1987 | Howarth et al. | 367/156 |
| 4,743,792 | 5/1988 | Ueyama | 310/328 |
| 4,757,223 | 7/1988 | Ueyama | 310/82 |
| 4,785,177 | 11/1988 | Besocke | 240/442.1 |
| 4,835,434 | 5/1989 | Marth | 310/328 |
| 5,039,894 | 8/1991 | Teter et al. | 310/26 |
| 5,041,753 | 8/1991 | Clark et al. | 310/328 |
| 5,068,565 | 11/1991 | Huang | 310/328 |
| 5,068,566 | 11/1991 | Culp | 310/328 |
| 5,182,484 | 1/1993 | Culp | 310/328 |
| 5,252,884 | 10/1993 | Dona | 310/328 |

FOREIGN PATENT DOCUMENTS

| | | | |
|---|---|---|---|
| 0033803 | 8/1981 | European Pat. Off. | 310/26 |
| 0223913 | 12/1968 | U.S.S.R. | 310/26 |
| 0595812 | 2/1978 | U.S.S.R. | 310/26 |

Primary Examiner—Steven L. Stephan
Assistant Examiner—D. R. Haszko
Attorney, Agent, or Firm—Jacob Shuster

[57] ABSTRACT

A plurality of drive modules positioned at spaced locations along a drive path of a driven member respectively include two magnetostrictive rod elements in alignment with each other, with adjacent ends thereof in engagement with a third magnetostrictive rod element extending transversely of the drive path to engage the driven member. Simultaneous elongation and contraction of the two rod elements during elongation of the third rod element in the drive modules imparts unidirectional motion to the driven member.

11 Claims, 3 Drawing Sheets

5,341,056

MAGNETOSTRICTIVE MOTOR SYSTEM

BACKGROUND OF THE INVENTION

This invention relates generally to the conversion of electrical power into mechanical power and more particularly in the use of magnetostriction to accomplish such purpose.

Magnetostriction motors are generally well known in the art and involve the use of an active element having magnetostrictive or electrostrictive properties, such as an elongated rod which undergoes dimensional change when magnetized by a field generated by electrical energization of a surrounding drive coil, as disclosed for example in U.S. Pat. No. 2,105,479 to Hayes. The use of a plurality of such magnetostrictive rods interconnected in various arrangements are also known in the art, as disclosed for example in U.S. Pat. Nos. 3,439,199 and 3,634,742 to Bergstrand et al and Edson, respectively.

The foregoing magnetostrictive motors transform electrical power directly into mechanical motion. In conventional electrodynamic motors, a unidirectional output exerting a substantial driving force is obtained by use of unwieldy and costly reduction gear boxes with an accompanying decrease in output speed. Such gear boxes are usually associated with undesirable backlash and friction creating problems in maintaining desirable performance.

It is therefore an important object of the present invention to magnetostrictively transform electrical power into mechanical unidirectional motion under high driving force without gear boxes and the aforementioned problems associated therewith.

Another object of the invention in accordance with the foregoing object is to more directly and efficiently convert electrical power into unidirectional motion by utilization of magnetostrictive materials.

SUMMARY OF THE INVENTION

In accordance with the present invention, a plurality of magnetostrictive drive modules of an electromotive device are operatively positioned in spaced relation to each other for producing either linear or rotary motion along a driven path. Each module includes three active magnetostrictive rod elements that are dimensionally variable and positioned within a drive control zone formed between spaced reaction surface portions of a stationary frame. The modules are electrically energized during drive cycles to simultaneously cause dimensional changes of the rod elements in each module in continuous engagement with spaced reaction surfaces of the frame. Magnetostrictive elongation and contraction of the rod elements in engagement with each other transmits displacing forces to one of the rod elements in a direction transverse to its longitudinal axis along which it is magnetostrictively elongated for intermittent engagement with a driven member. A high driving force is thereby produced during each drive cycle in the direction transverse to the axis of the force transmitting rod element to unidirectionally displace the driven member. Driving forces are obtained by means of the foregoing arrangement as a result of high atomic forces of magnetostriction in the rod elements of a plurality of such drive modules.

BRIEF DESCRIPTION OF DRAWING FIGURE

Other objects, advantages and novel features of the invention will become apparent from the following detailed description of the invention when considered in conjunction with the accompanying drawing wherein.

DETAILED DESCRIPTION OF PREFERRED EMBODIMENT

Figure 1:
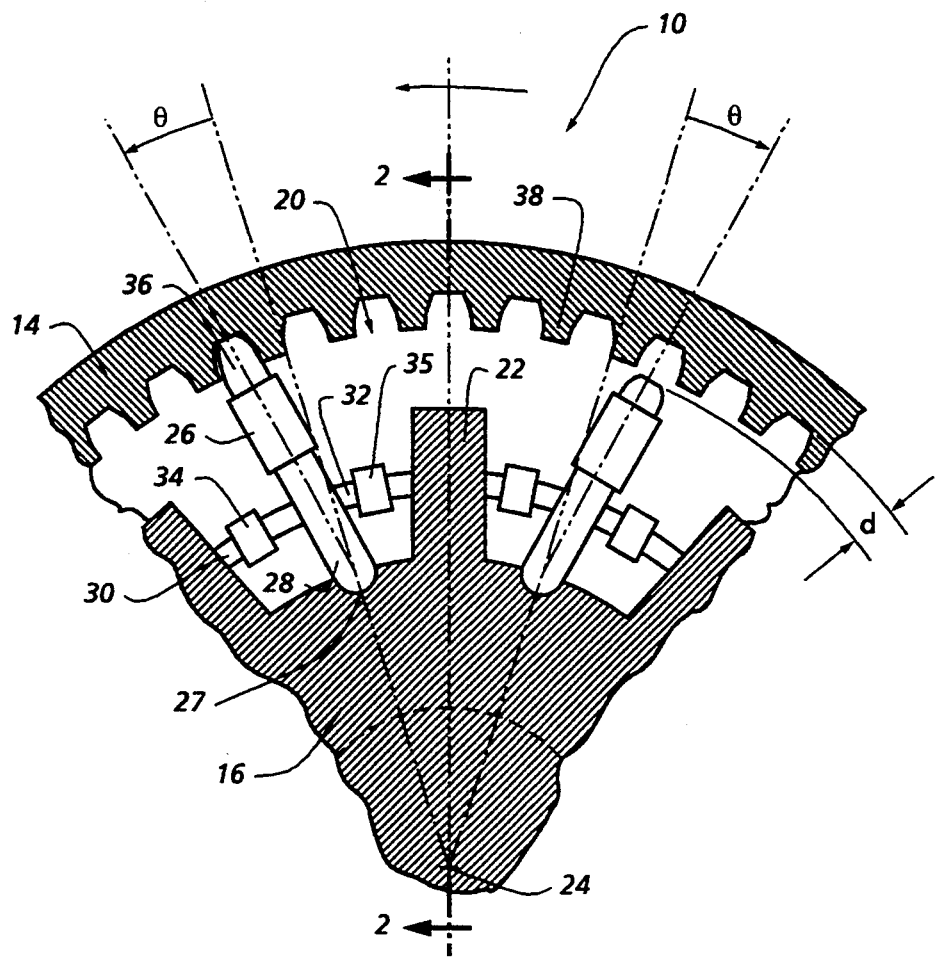
FIG. 1 is a partial transverse section view of a magnetostrictive motor constructed in accordance with one embodiment of the invention.
Figure 2:
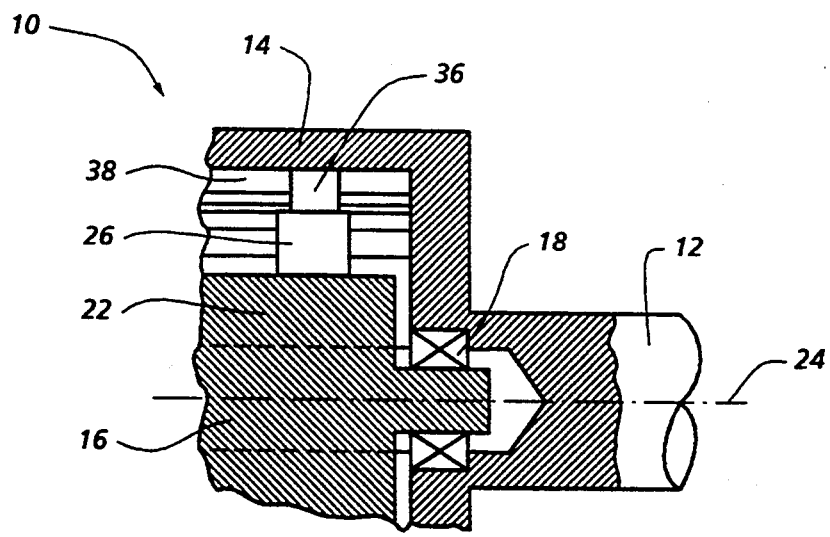
FIG. 2 is a partial side section view taken substantially through a plane indicated by section line 2—2 in FIG. 1.

Referring now to the drawing in detail, FIGS. 1 and 2 illustrate a rotary type of magnetostriction motor generally referred to by reference numeral 10 constructed in accordance with one embodiment of the invention. In this embodiment of the invention, a mechanical power output shaft 12, as shown in FIG. 2, extends from a driven member in the form of an annular rotor 14 of circular cross-section. The rotor 14 is journaled by bearings 18 on a stationary support shaft 16 acting as a reaction anchor frame in axial alignment with rotor shaft 12. Mounted within the rotor 14 about the anchor shaft 16 are a plurality of magnetostrictive drive modules, respectively referred to by reference numeral 20, as shown in FIG. 1. According to the illustrated embodiment of the invention, each of the modules 20 includes a pair of magnetostrictive spacer rod elements 30 and 32 disposed in radially spaced relation to the anchor shaft 16. The opposite remote ends of the magnetostrictive elements 30 and 32 are in abutment with reaction surfaces on frame extensions 22 projecting radially from the shaft 16 to define therebetween the drive control zones within which modules 20 are located. Magnetic field applying coils 34 and 35 are respectively mounted on the two dimensionally variable rod elements 30 and 32 of each module, as shown, to generate properly phased magnetic fields with respect to their axes aligned with a circular driven path having an axis 24 common to shafts 12 and 16 in the embodiment shown in FIGS. 1 and 2.

Each of the modules 20 also includes a third magnetostrictively active, force transmitting rod element 28 having a radially inner reaction end in engagement with the anchor shaft 16 to establish thereon a pivot 27 about which element 28 is angularly displaced. A field applying coil 26 on the element 28 is energized to project its radially outer force transmitting end into engagement with the rotor 14 as shown in FIGS. 1 and 2. When in engagement with rotor 14, the rod element 28 transmits torque thereto generated by forces exerted in response to simultaneous elongation and contraction of rod elements 30 and 32 in engagement with the rod element 28 between its opposite longitudinal ends to effect angular displacement thereof relative to the pivot 27 at its radially inner end in engagement with a pivot bearing recess in the shaft 16. As shown in FIG. 1, the radially outer end of rod element 28 is in the form of a gear tooth 36 adapted to be projected into meshing engagement with internal gear formation 38 on the rotor 14.

Figure 3:
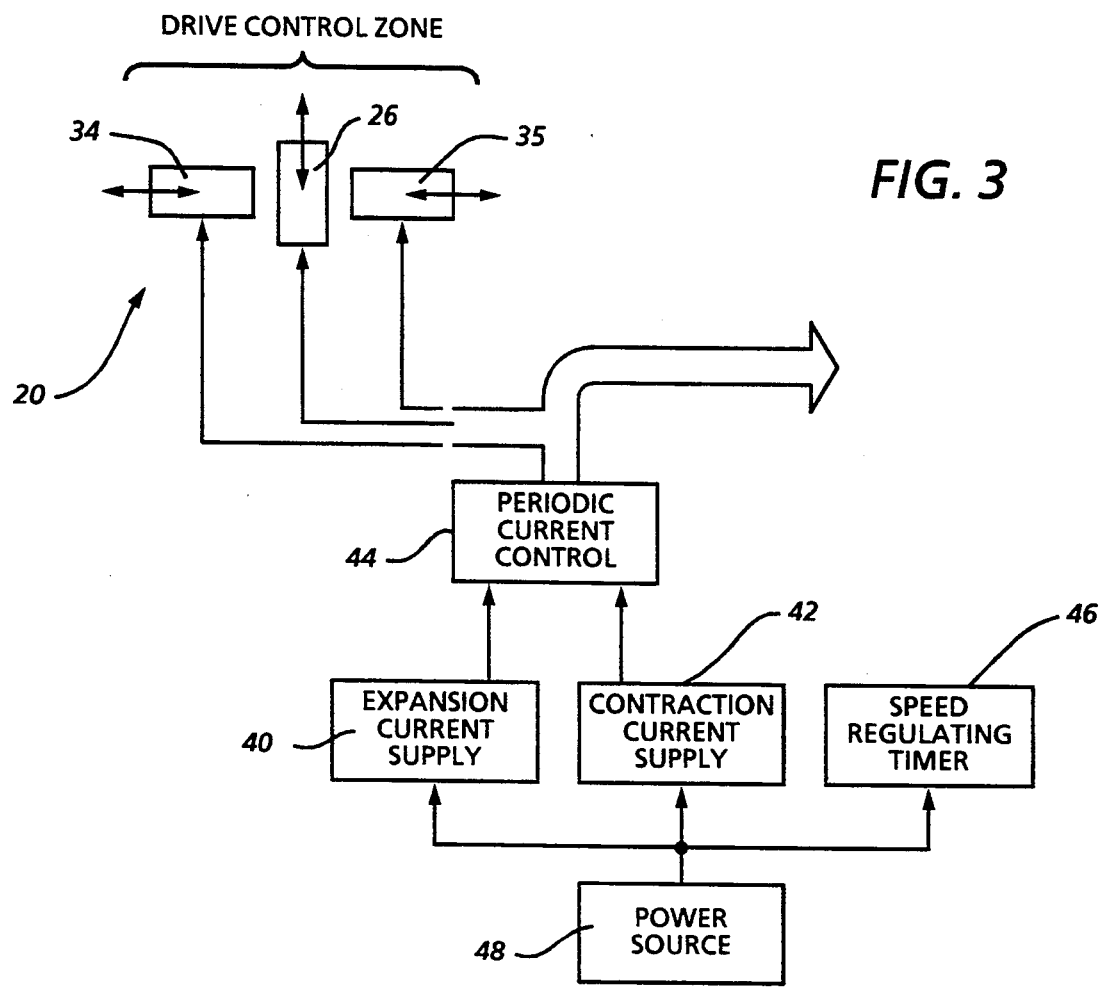
FIG. 3 is a simplified block diagram of the electrical power system associated with the motor depicted in FIGS. 1 and 2.
Figure 4:
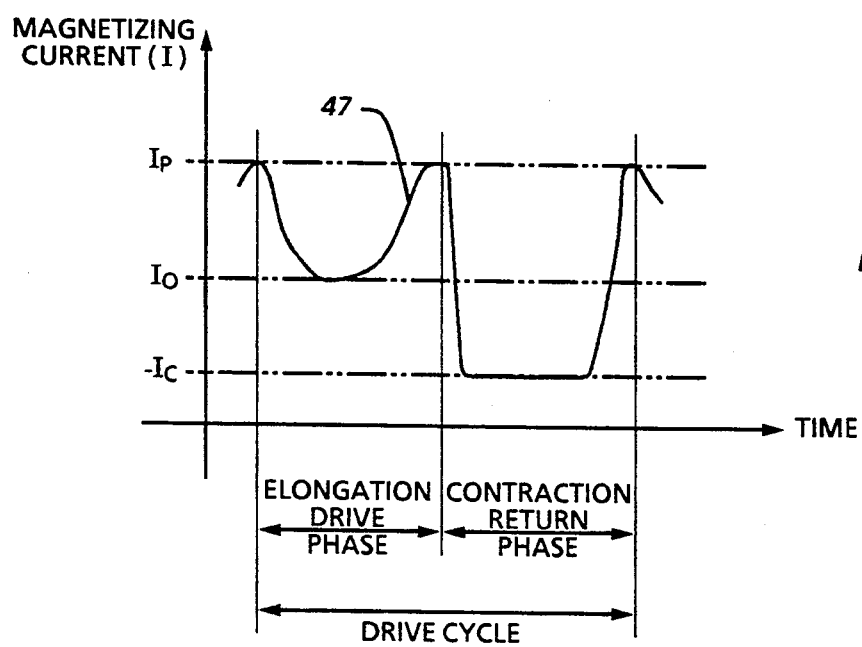
FIG. 4 is a graphical representation of the cyclic control of electrical magnetizing current supply of the power system diagrammed in FIG. 3.

As diagrammed in FIG. 3, a suitable source of electrical power 48 is connected to coil driver power supplies 40 and 42 by means of which magnetic fields for the rod elements 28, 30 and 32 are simultaneously established through their coils 26, 34 and 35 in each of the modules 20. Accordingly, the two force generating rod elements 30 and 32 are magnetostrictively deformed in opposite directions while at the same time the drive element 28 is magnetostrictively elongated in a direction transverse thereto for intermittent driving engagement at its radially outer force transmitting end with rotor 14. Such simultaneous and opposite dimensional changes of the two rod elements 30 and 32 in engagement with spaced reaction surfaces on frame extensions 22 in each module 20, exerts driving forces on the drive element 28 simultaneously elongated or contracted in a radial direction by a distance (d) as denoted in FIG. 1 to cyclically engage and disengage the gear formation 38 on rotor 14. Rotational torque is thereby simultaneously applied by alternate modules 20 to the rotor during each drive cycle. The rotor will thus undergo unidirectional angular displacement by a limited amount ($\theta$) during each operational cycle. At the end of each drive cycle, dimensional changes of the rod elements in adjacent modules are reversed under control of a periodic current control component 44 as diagrammed in FIG. 3 so as to switch between the alternate modules transmitting torque to the rotor. FIG. 4 graphically depicts the cyclically variable current supplied, by way of example to the magnetizing coil 26 by means of current control 44 for elongation and contraction of drive element 28 during drive and return phases, respectively, of each drive cycle. As shown, the current depicted by curve 47 decreases from and increases to a peak level ($I_p$) relative to a minimum level ($I_o$) to controllably vary elongation of element 28 so as to maintain proper engagement with gear formation 38 while element 28 is being angularly displaced during the drive phase of the cycle. The return phase of the drive cycle as shown in FIG. 4 is characterized by a sharp drop and reversal of magnetizing current to a level ($-I_c$) to effect contraction of drive element 28 so as to disengage it from the gear formation.

The rotational speed of the rotor 14 will depend on the duration of the drive cycles. The power source 48 as diagrammed in FIG. 3 is accordingly connected to control 44 through a speed regulating timer 46 that is selectively adjustable to establish the duration of the drive cycles of the modules thereby controlling intermittent application of unidirectional torque to the rotor in response to directionally reversing energization of adjacent modules 20.

Figure 5:
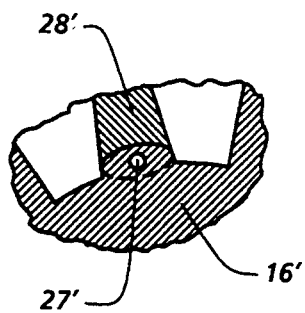
FIG. 5 is a partial section view showing certain modifications of the motor depicted in FIG. 1.

In the embodiment described with respect to FIGS. 1 and 2, the driven path with which the rod elements 30 and 32 are aligned is circular. As shown in FIG. 5, a pivot is established at the radially inner end of a modified drive element 28' by a pivot pin 27' carried by projections from the frame shaft 16'. In the case of a linear type of motor, the driven path would be straight with corresponding modifications of the frame and driven member.

Figure 6:
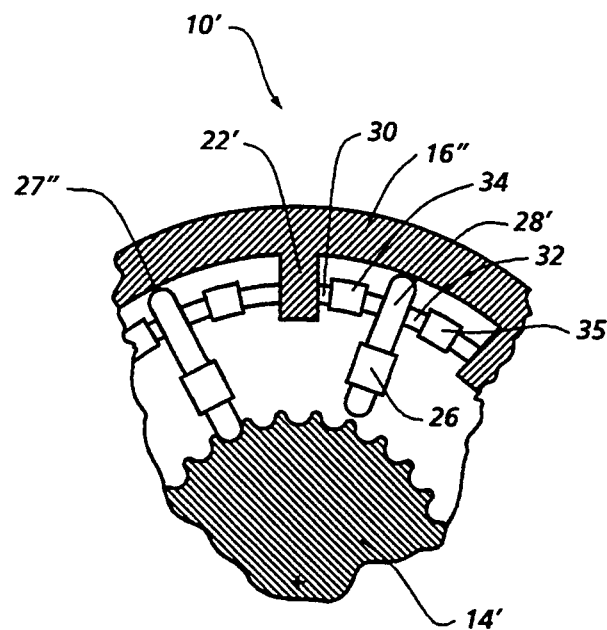
FIG. 6 is a partial transverse section view of a magnetostrictive motor in accordance with another embodiment of the invention.

For a rotary type of motor 10' as shown in FIG. 6, the relative positions of the frame and rotor are reversed and magnetostrictive modules are formed between a radially inner rotor shaft 14' and a radially outer annular reaction frame 16' from which spaced extensions 22' project. Operation of rotary motor 10' is generally the same as described with respect to the motor 10 of FIGS. 1 and 2, except for the positional reversal of the radial rod elements 28' in each of the drive modules so as to establish the pivots 27'' at the radially outer ends thereof. Also, driving engagement of the rod elements at the radially inner ends with the driven rotor 14' is enhanced by groove formations 38' therein as shown in FIG. 6.

Figure 7:
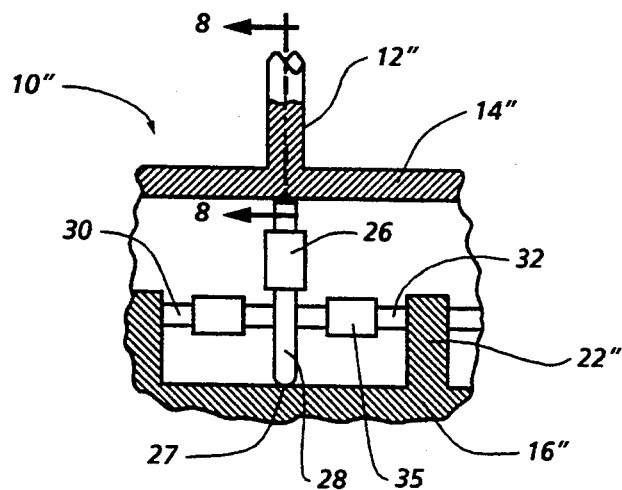
FIG. 7 is a partial side section view of a motor in accordance with yet another embodiment of the invention.
Figure 8:
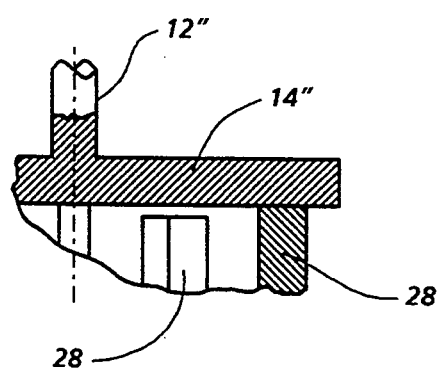
FIG. 8 is a partial section view taken substantially through a plane indicated by section line 8—8 in FIG. 7.

FIGS. 7 and 8 illustrate a further modified form of rotary motor 10'' having the drive modules thereof angularly spaced on a flat surfaced reaction frame 16'' from which the extensions 22'' project toward a flat disc type of rotor 14''. The rotor disc 14'' is axially spaced from frame 16'' along its axis extending through a rotor shaft 12'' for example. The rod elements 28 are magnetostrictively elongated into engagement with a frictional contact surface of rotor disc 14'', and contracted during alternate drive cycles, for unidirectional drive of the rotor disc under control of a system as hereinbefore described with respect to FIGS. 3 and 4.

Numerous other modifications and variations of the present invention are possible in light of the foregoing teachings. It is therefore to be understood that within the scope of the appended claims the invention may be practiced otherwise than as specifically described.

What is claimed is:

1. In a magnetostrictive device including a movable member, a stationary support, a plurality of rods possessing magnetostrictive properties, each of said rods having force transmitting and reaction end portions spaced from each other, the reaction end portions of the rods being in continuous engagement with the support at spaced locations thereon, the force transmitting end portion of one of the rods being intermittently engageable with the movable member while the force transmitting end portions of the other of the rods are in continuous engagement with said one of the rods.

2. In the device set forth in claim 1, electrical power means for effecting periodic dimensional change only in a predetermined direction and means for conversion of said periodic dimensional change into mechanical motion of the moveable member, force generating means in engagement with the rods for mechanical displacement thereof in directions transverse to said predetermined direction, and means operatively interconnecting the power means with the force generating means for controlling said displacement of the rods during said periodic dimensional change thereof.

3. The improvement as defined in claim 2 wherein said rods and said force generating means have longitudinal axes respectively extending along said predetermined direction and the directions transverse thereto.

4. The device as defined in claim 3 wherein the motion conversion means includes means for guiding displacement of the other of the rods in said direction transverse to the predetermined direction along which said one of the rods is dimensionally changed and drive engaging means mounted on the movable member for engagement by said one of the rods during said periodic dimensional change thereof to impart said motion to the movable member unidirectionally.

5. The combination of claim 4 wherein said drive engaging means comprises a gear formation.

6. The combination of claim 4 wherein said drive engaging means comprises a frictional contact surface.

7. The device as defined in claim 2 wherein the motion conversion means includes means for guiding displacement of the other of the rods in said direction traverse to the predetermined direction along which said one of the rods is dimensionally changed and drive engaging means mounted on the movable member for engagement by said one of the rods during said periodic dimensional change thereof to impart said motion to the movable member unidirectionally.

8. In a device for converting electrical energy into mechanical energy, including a rotor, at least one magnetostrictive module, a power source, and means connected to said source for inducing opposite dimensional changes within the module to unidirectionally transmit torque to the rotor, the improvement residing in: a reaction frame, said module including at least three active elements within which said dimensional changes are induced while in continuous spaced engagement with the frame and means positioning said elements in engagement with each other for inducing displacement of one of the active elements while in engagement with the rotor in response to said dimensional changes.

9. In the device set forth in claim 8, wherein said one of the active elements undergoes said dimensional change thereof periodically in a predetermined direction, the reaction frame having fixed reaction surfaces engaged by the active elements and defining a drive control zone within which said one of the active elements is located while being displaced transversely of said predetermined direction.

10. The combination of claim 9 wherein said rotor is a toothed gear.

11. The combination of claim 9 wherein said rotor is a frictional gear.

* * * * *